(12) United States Patent
Tomori

(10) Patent No.: US 12,134,534 B2
(45) Date of Patent: Nov. 5, 2024

(54) ADHESIVE FILM PRODUCTION APPARATUS AND ADHESIVE FILM PRODUCTION METHOD

(71) Applicant: Resonac Corporation, Tokyo (JP)

(72) Inventor: Naoki Tomori, Tokyo (JP)

( * ) Notice: Subject to any disclaimer, the term of this patent is extended or adjusted under 35 U.S.C. 154(b) by 226 days.

(21) Appl. No.: 17/791,994

(22) PCT Filed: Jan. 29, 2021

(86) PCT No.: PCT/JP2021/003317
§ 371 (c)(1),
(2) Date: Jul. 11, 2022

(87) PCT Pub. No.: WO2021/161814
PCT Pub. Date: Aug. 19, 2021

(65) Prior Publication Data
US 2023/0040595 A1   Feb. 9, 2023

(30) Foreign Application Priority Data

Feb. 12, 2020   (JP) ................................. 2020-021342

(51) Int. Cl.
*B65H 18/08*    (2006.01)
*B65H 23/195*   (2006.01)
(Continued)

(52) U.S. Cl.
CPC ......... *B65H 18/08* (2013.01); *B65H 23/1955* (2013.01); *B65H 35/02* (2013.01);
(Continued)

(58) Field of Classification Search
CPC .... B65H 18/08; B65H 35/02; B65H 23/1955; B65H 2301/5155; B65H 2701/1722
See application file for complete search history.

(56) References Cited

U.S. PATENT DOCUMENTS

| | | | |
|---|---|---|---|
| 2001/0053430 A1* | 12/2001 | Ishikawa | B41J 31/00 428/343 |
| 2008/0149756 A1* | 6/2008 | Kuwabara | B65H 18/106 242/598 |

(Continued)

FOREIGN PATENT DOCUMENTS

| | | |
|---|---|---|
| JP | 2000-136056 | 5/2000 |
| JP | 2002-080167 | 3/2002 |

(Continued)

OTHER PUBLICATIONS

International Preliminary Report on Patentability with Written Opinion dated Aug. 25, 2022 for PCT/JP2021/003317.

(Continued)

*Primary Examiner* — Sang K Kim
(74) *Attorney, Agent, or Firm* — SOEI PATENT & LAW FIRM

(57) ABSTRACT

Provided is an adhesive film production apparatus for producing an adhesive film having an adhesive layer on a base material layer, the adhesive layer having an elastic modulus at 230° C. of 1 MPa or greater and having a glass transition temperature higher than normal temperature, the adhesive film production apparatus including a feeding roller; a cutting part; and a plurality of winding cores, wherein the raw film of the adhesive film is wound on the feeding roller such that the adhesive layer faces outward, and wherein in the conveyance path of the adhesive film traveling from the cutting part toward the winding core, the number of times of the adhesive layer of the adhesive film bending in a convex manner is set to be equal to or more than the number of times of the adhesive layer bending in a concave manner.

20 Claims, 8 Drawing Sheets

(51) Int. Cl.
  *B65H 35/02* (2006.01)
  *C09J 7/38* (2018.01)
  *H01L 21/56* (2006.01)

(52) U.S. Cl.
  CPC ......... *C09J 7/38* (2018.01); *B65H 2301/5155* (2013.01); *B65H 2701/11332* (2013.01); *B65H 2701/1722* (2013.01); *C09J 2203/326* (2013.01); *C09J 2301/502* (2020.08); *H01L 21/568* (2013.01)

(56) References Cited

U.S. PATENT DOCUMENTS

2012/0292424 A1\* 11/2012 Shin ................. B65H 35/08
                                                  242/525.6
2019/0389121 A1\* 12/2019 Kataoka ............ B29C 53/56

FOREIGN PATENT DOCUMENTS

| JP | 2005-206358 | 8/2005 |
| JP | 2006-264823 | 10/2006 |
| JP | 2010-070377 | 4/2010 |
| JP | 2010-084121 | 4/2010 |
| JP | 2010-120741 | 6/2010 |
| JP | 3172995 | 1/2012 |
| JP | 3209784 | 4/2017 |
| TW | 200829496 | 7/2008 |
| TW | 201249572 | 12/2012 |
| TW | 202000571 | 1/2020 |
| WO | 01/035460 | 5/2001 |
| WO | 2014/065262 | 5/2014 |
| WO | 2019/176597 | 9/2019 |

OTHER PUBLICATIONS

International Preliminary Report on Patentability with Written Opinion dated Aug. 25, 2022 for PCT/JP2021/003318.
International Search Report dated Apr. 20, 2021 for PCT/JP2021/003317.
International Search Report dated Apr. 20, 2021 for PCT/JP2021/003318.
SOEI Patent and Law Firm, Statement of Related Matters, dated Aug. 19, 2022.

\* cited by examiner

ADHESIVE FILM PRODUCTION APPARATUS AND ADHESIVE FILM PRODUCTION METHOD

CROSS-REFERENCE TO RELATED APPLICATIONS

This application is a 35 U.S.C. § 371 national phase application of PCT/JP2021/003317, filed on Jan. 29, 2021, which claims priority to Japanese Patent Application No. 2020-021342 filed on Feb. 12, 2020.

TECHNICAL FIELD

The present disclosure relates to an adhesive film production apparatus and a method for producing an adhesive film.

BACKGROUND ART

Conventional semiconductor packages have a structure which includes a semiconductor element adhered onto a die pad, and a lead frame joined to the semiconductor element with a wire, and in which the entirety except for outer leads for external connection is sealed with a resin. As the demand for density increase, area reduction, thickness reduction, and the like of semiconductor packages has increased in recent years, for example, semiconductor packages having a structure in which only one surface (semiconductor element side) of a package is sealed, as in the case of a QFN (Quad Flat Non-leaded) package, have been developed.

In a semiconductor package having a structure in which only one surface of the package is sealed, since a lead frame is not protruding through the sealing resin, area reduction and thickness reduction of the package can be attempted. However, there may occur a defect that the sealing resin wraps around the back surface of the lead frame at the time of sealing. As a method for preventing such a defect, for example, as in the case of Patent Literature 1, there is a method of sticking an adhesive film as a temporary protective film to the back surface of the lead frame. In this method, sealing of a semiconductor element is performed in a state in which the back surface of a lead frame is temporarily protected with an adhesive film, and subsequently the adhesive film is peeled off from the back surface of the lead frame.

CITATION LIST

Patent Literature

Patent Literature 1: International Publication WO 2001/035460

SUMMARY OF INVENTION

Technical Problem

An adhesive film that is used as a temporary protective film is formed by, for example, cutting a raw film that is continuously paid out from a feeding roller to an arbitrary width. Each of the adhesive films cut out into each width is wound around a winding core and is handled as a reel body. At the site of use of the adhesive film, the adhesive film is drawn out from the reel body, and sticking of the adhesive film to the back surface of a lead frame is performed.

In recent years, in a step of bonding wires to a semiconductor element and a lead frame, an adhesive film having a relatively high elastic modulus of the adhesive layer as compared with conventional adhesive films may be used in order to suppress defective joining of the wires. In such an adhesive film, softening of the adhesive layer in a step of bonding wires can be suppressed, and the occurrence of defective joining of the wires can be suppressed. On the other hand, in addition to the high magnitude of the elastic modulus of the adhesive layer, when the glass transition temperature of the adhesive layer is higher than normal temperature, the warpage when drawing out the adhesive film from a reel body at the time of use tends to become large as compared with conventional adhesive films. In a case where warpage occurs in the adhesive film, there is concern that when the adhesive film is stuck to a lead frame, the alignment accuracy of the two may be affected.

The present disclosure was achieved in order to solve the above-described problems, and it is an object of the present disclosure to provide an adhesive film production apparatus that can produce an adhesive film in which the warpage at the time of use is suppressed, and a method for producing an adhesive film.

Solution to Problem

An adhesive film production apparatus according to an aspect of the present disclosure is an adhesive film production apparatus that produces an adhesive film having an adhesive layer on a base material layer, the adhesive layer having an elastic modulus at 230° C. of 1 MPa or greater and having a glass transition temperature higher than normal temperature, the adhesive film production apparatus including a feeding roller for continuously feeding a raw film of an adhesive film; a cutting part for cutting the raw film of the adhesive film into a plurality of adhesive films having predetermined widths; and a plurality of winding cores for winding the plurality of adhesive films, respectively, wherein the raw film of the adhesive film is wound around the feeding roller such that the adhesive layer faces outward, and wherein in the conveyance path of the adhesive film traveling from the cutting part toward the winding core, the number of times of the adhesive layer of the adhesive film bending in a convex manner is equal to or more than the number of times of the adhesive layer bending in a concave manner.

In this adhesive film production apparatus, the raw film of the adhesive film is wound around the feeding roller such that the adhesive layer faces outward. Furthermore, in the conveyance path of the adhesive film traveling from the cutting part toward the winding core, the number of times of the adhesive layer of the adhesive film bending in a convex manner is equal to or more than the number of times of the adhesive layer bending in a concave manner. In an adhesive film having an adhesive layer on a base material layer, usually, a warpage in which the adhesive layer side having a lower elastic modulus compared with the base material layer becomes a valley is likely to occur. In a case where the elastic modulus of the adhesive layer is relatively high, and the glass transition temperature is higher than normal temperature, there is a tendency that once warpage occurs in the adhesive film, warpage is less likely to be reduced even when flexure is increased. In contrast, in this adhesive film production apparatus, on the occasion that the adhesive film travels from the feeding roller through the cutting part and is wound on the winding core, flexure that causes the adhesive layer side to have a convex shape is actively imparted to the adhesive film. Therefore, in the adhesive film wound around the winding core, warpage is canceled, and the warpage at the time of use can be suppressed.

Each of the plurality of winding cores may have a width larger than the width of the adhesive film as an object of winding. In this case, winding of the adhesive films having different widths can be performed by using winding cores having the same width. Therefore, reduction of the cost required for winding cores and simplification of the management of winding cores can be promoted. Furthermore, since the edge parts of a winding core protrude from the adhesive film as an object of winding, when the adhesive film wound around the winding core is used, alignment of the adhesive film is made easier by utilizing the protruding portion of the winding core.

Each of the plurality of winding cores may be disposed such that an edge part of the winding core protrudes only on one side in an axial direction from the adhesive film as an object of winding. In this case, when the adhesive film wound around the winding core is used, alignment of the adhesive film is made easier.

Each of the plurality of winding cores may be disposed such that edge part of the winding core protrudes on both sides in an axial direction from the adhesive film as an object of winding, and an amount of protrusion on one side in the axial direction is larger than an amount of protrusion on the other side. In this case, when the adhesive film wound around the winding core is used, alignment of the adhesive film is made much easier.

The cutting part may cut the raw film of the adhesive film into a plurality of adhesive films having different widths. As a result, adhesive films having different widths can be produced all at one time.

Winding tension may be applied to the raw film and a plurality of adhesive films between the feeding roller and the winding cores. As a result, sliding of the adhesive film at the time of winding the adhesive film on the winding core can be suppressed.

The method for producing an adhesive film according to an aspect of the present disclosure is a method for producing an adhesive film, by which an adhesive film having an adhesive layer on a base material layer is produced, the adhesive layer having an elastic modulus at 230° C. of 1 MPa or greater and having a glass transition temperature higher than normal temperature, the method including a feeding step of feeding a raw film of an adhesive film continuously from a feeding roller; a cutting step of cutting the raw film of the adhesive film into a plurality of adhesive films having predetermined widths by a cutting part; and a winding step of winding the plurality of adhesive films on a plurality of winding cores, respectively, wherein in the feeding step, the raw film of the adhesive film is wound around the feeding roller such that the adhesive layer faces outward, and wherein in the winding step, in the conveyance path of the adhesive film traveling from the cutting part toward the winding cores, the number of times of the adhesive layer of the adhesive film bending in a convex manner is set to be equal to or more than the number of times of the adhesive layer bending in a concave manner.

In this method for producing an adhesive film, the raw film of the adhesive film is wound around the feeding roller such that the adhesive layer faces outward. Furthermore, in the conveyance path of the adhesive film traveling from the cutting part toward the winding core, the number of times of the adhesive layer of the adhesive film bending in a convex manner is set to be equal to or more than the number of times of the adhesive layer bending in a concave manner. In the adhesive film having an adhesive layer on a base material layer, usually, the warpage in which the adhesive layer side having a lower elastic modulus compared with the base material layer becomes a valley is likely to occur. When the elastic modulus of the adhesive layer is relatively high, and the glass transition temperature is higher than normal temperature, there is a tendency that once warpage occurs in the adhesive film, warpage is less likely to be reduced even when flexure is increased. In this method for producing an adhesive film, on the occasion that the adhesive film travels from the feeding roller through the cutting part and is wound on the winding core, flexure that causes the adhesive layer side to have a convex shape is actively imparted to the adhesive film. Therefore, in the adhesive film wound around the winding core, warpage is canceled, and the warpage at the time of use can be suppressed.

In the winding step, the width of each of the plurality of winding cores may be made larger than the width of the adhesive film as an object of winding. In this case, winding of adhesive films having different widths can be performed by using winding cores having the same width. Therefore, reduction of the cost required for winding cores and simplification of the management of winding cores can be promoted. Furthermore, since the edge parts of the winding core protrude from the adhesive film as an object of winding, when the adhesive film wound around the winding core is used, alignment of the adhesive film is made easier by utilizing a protruding portion of the winding core.

In the winding step, each of the plurality of winding cores may be disposed such that an edge part of the winding core protrudes only on one side in an axial direction from the adhesive film as the object of winding. In this case, when the adhesive film wound on the winding core is used, alignment of the adhesive film is made much easier.

In the winding step, since edge parts of the winding core protrude on both sides in an axial direction from the adhesive film as the object of winding, each of the plurality of winding cores may be disposed such that an amount of protrusion on one side in an axial direction is larger than an amount of protrusion on the other side. In this case, when the adhesive film wound around the winding core is used, alignment of the adhesive film is made much easier.

In the cutting step, the raw film of the adhesive film may be cut out into a plurality of adhesive films having different widths. As a result, adhesive films having different widths can be produced all at one time.

Winding tension may be applied to the raw film and the plurality of adhesive films between the feeding roller and the winding cores. As a result, sliding of the adhesive film at the time of winding the adhesive film on the winding core can be suppressed.

Advantageous Effects of Invention

According to the present disclosure, an adhesive film in which warpage at the time of use is suppressed can be produced.

DESCRIPTION OF EMBODIMENTS

Hereinafter, suitable embodiments of the adhesive film production apparatus and the method for producing an adhesive film according to an aspect of the present disclosure will be described in detail with reference to the drawings.

[Adhesive Film]

Figure 1:
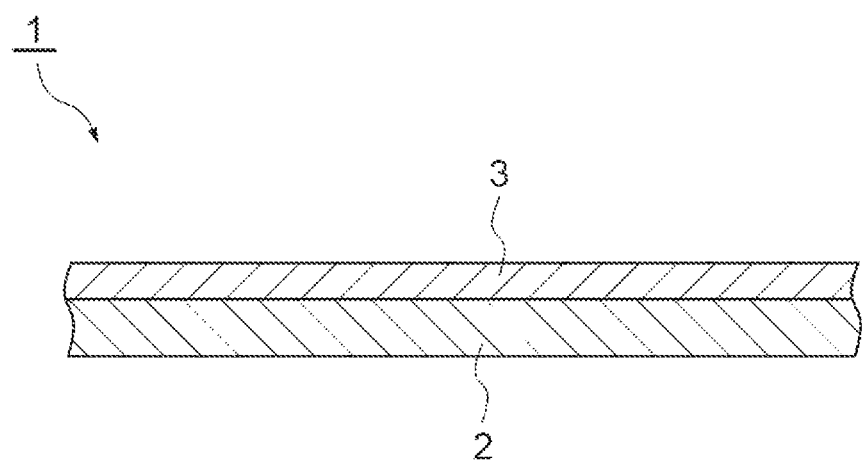
FIG. 1 is a schematic cross-sectional view illustrating an embodiment of an adhesive film.

First, the configuration of an adhesive film produced by an adhesive film production apparatus will be described. FIG. 1 is a schematic cross-sectional view illustrating an embodiment of the adhesive film. The adhesive film 1 shown in FIG. 1 is, for example, a film that is used for temporary protection of a lead frame in a sealing step of sealing a semiconductor element mounted on the lead frame. In the sealing step, the adhesive film 1 is stuck to the back surface of the lead frame (surface on the opposite side of the surface where the semiconductor element is formed) and temporarily protects the lead frame while a sealing layer for sealing the semiconductor element is formed. The adhesive film 1 is peeled off from the back surface of the lead frame after the sealing step is completed.

Figure 3:
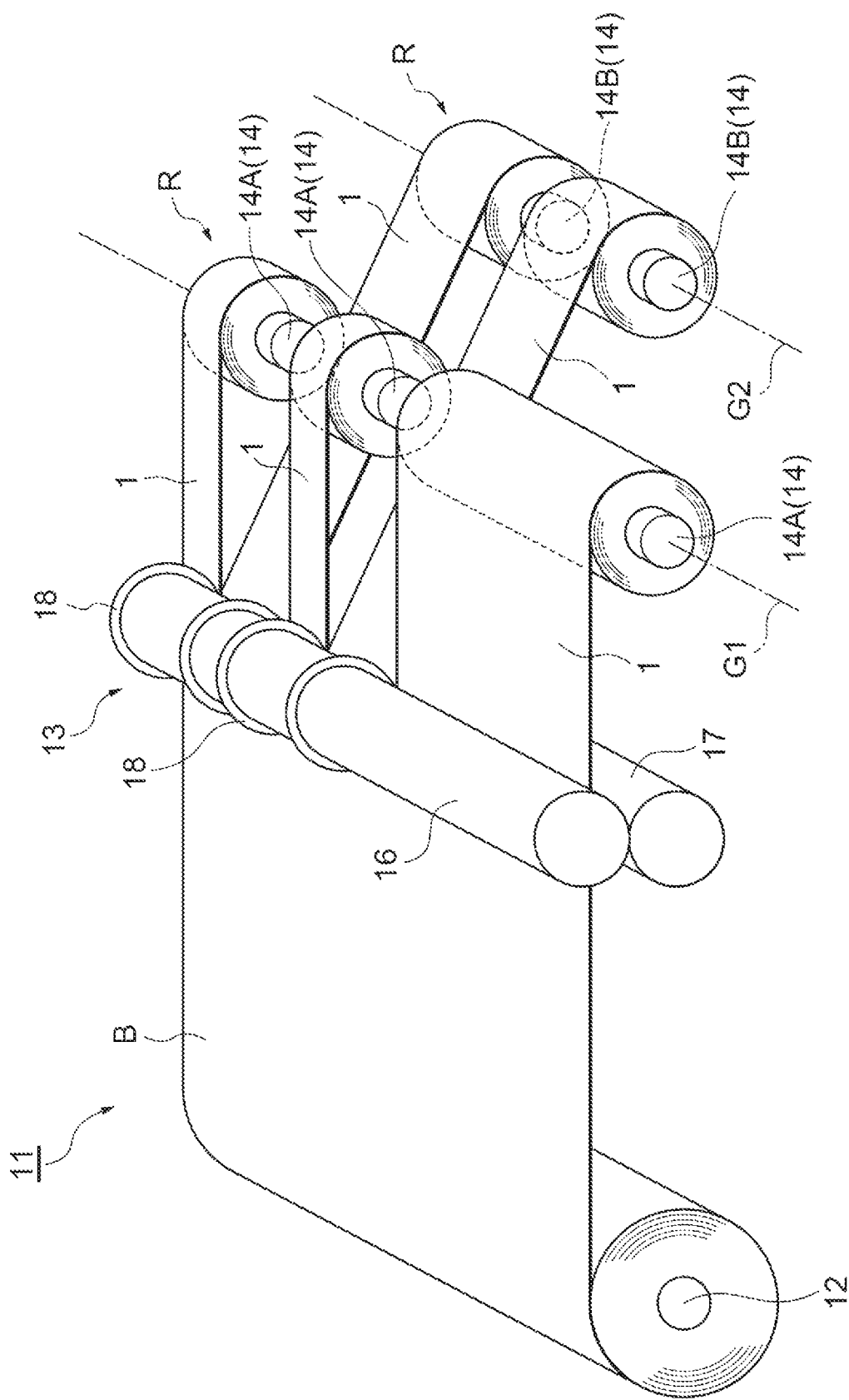
FIG. 3 is a schematic perspective view illustrating an embodiment of an adhesive film production apparatus.

The adhesive film 1 is handled, for example, in a reel body state of being wound around a winding core 14 (see FIG. 3). The adhesive film 1 may be handled in a state in which the reel body is housed in a packaging bag. In this case, a single reel body may be housed in the packaging bag, or a plurality of reel bodies may be housed in the packaging bag. The packaging bag may be formed by using a resin film or may be formed by using a composite resin film having an aluminum layer. Specific examples of the packaging bag include a bag made of an aluminum-coated plastic. Examples of the material of the resin film include plastic such as polyethylene, polyester, vinyl chloride, and polyethylene terephthalate. The reel body may be housed in the packaging bag, for example, in a vacuum packed state. In the packaging bag, a desiccant may be housed together with the reel body. Regarding the desiccant, for example, silica gel may be mentioned. The package may be further wrapped with a cushioning material. The package may be housed in, for example, a packing box such as corrugated cardboard.

As shown in FIG. 1, the adhesive film 1 is configured to have two layers composed of a base material layer 2 and an adhesive layer 3 provided on one surface side of the base material layer 2. The width of the adhesive film 1 is, for example, 50 mm or more. The width of the adhesive film 1 may be 100 mm or more or may be 200 mm or more. The width of the adhesive film 1 may be 600 mm or less. The width of the adhesive film 1 may be, for example, 50 mm or more and 600 mm or less, may be 100 mm or more and 600 mm or less, or may be 200 mm or more and 600 mm or less.

The coefficient of linear expansion at 30° C. to 200° C. on the in-plane direction of the adhesive film 1 is, for example, 16 ppm/° C. or greater and 20 ppm/° C. or less. The in-plane direction may be, for example, either the MD (Machine Direction) direction or the TD (Transverse Direction) direction. The MD direction is usually the longitudinal direction of the adhesive film 1. The TD direction is a direction (width direction) orthogonal to the MD direction. The measurement of the coefficient of linear expansion can be measured by means of a thermomechanical analysis apparatus (for example, manufactured by Seiko Instruments Inc.: SSC5200). The coefficient of linear expansion at 30° C. to 200° C. in the in-plane direction of the adhesive film 1 can be adjusted by, for example, changing the thickness of the adhesive layer 3.

The elastic modulus at 30° C. of the adhesive film 1 is, for example, 9 GPa or less. The elastic modulus at 30° C. of the adhesive film 1 may be 8 GPa or less or may be 7 GPa or less. The elastic modulus at 30° C. of the adhesive film 1 may be 4 GPa or greater or may be 5 GPa or greater. The elastic modulus at 30° C. of the adhesive film 1 can be measured by using a dynamic viscoelasticity measuring apparatus (for example, manufactured by UBM: Rheogel-E4000). In this case, a specimen obtained by cutting the adhesive film 1 into a size of, for example, 4 mm×30 mm is mounted on a dynamic viscoelasticity measuring apparatus at a distance between chucks of 20 mm. Then, the elastic modulus at 30° C. of the adhesive film 1 can be determined by measuring the tensile modulus of the specimen under the conditions of sine waves, a temperature range of 30° C. (constant), and a frequency of 10 Hz.

The base material layer 2 is composed of a material having heat resistance against the heat in each step of a step of forming an adhesive layer 3, a step of assembling a semiconductor package, and the like. Such a material may be, for example, at least one polymer selected from the group consisting of an aromatic polyimide, an aromatic polyamide, an aromatic polyamideimide, an aromatic polysulfone, an aromatic polyethersulfone, polyphenylene sulfide, an aromatic polyether ketone, polyallylate, an aromatic polyether ether ketone, and polyethylene naphthalate.

From the viewpoint of enhancing the heat resistance, the glass transition temperature of the base material layer 2 may be 200° C. or higher or may be 250° C. or higher. As a result, in the steps where heat is applied, that is, a step of adhering a semiconductor element to a die pad, a wire bonding step, a sealing step, and a step of tearing off the temporary protective film from a molded body, softening of the base material layer 2 is suppressed, and an enhancement of the operation efficiency can be promoted. The elastic modulus at 230° C. of the base material layer 2 is higher than the elastic modulus at 230° C. of the adhesive layer 3 (which will be described below).

It is preferable that the base material layer 2 has sufficient close adhesiveness to the adhesive layer 3. When the base material layer 2 has sufficient close adhesiveness to the adhesive layer 3, for example, at the time of tearing off the adhesive film 1 from the lead frame and the sealing material at a temperature of 100° C. to 300° C., the occurrence of peeling at the interface between the adhesive layer 3 and the base material layer 2 can be suppressed. As a result, the resin remaining on the lead frame and the sealing material can be suppressed.

From the viewpoint of sufficiently having both the heat resistance and the close adhesiveness to the adhesive layer 3, the base material layer 2 may be composed of polyimide. The coefficient of linear expansion at 30° C. to 200° C. of the base material layer 2 based on polyimide may be $3.0 \times 10^{-5}$/° C. or less, may be $2.5 \times 10^{-5}$/° C. or less, or may be $2.0 \times 10^{-5}$/° C. or less. The heat shrinkage rate of the base material layer 2 at the time of heating at 200° C. for 2 hours may be 0.15% or less, may be 0.1% or less, or may be 0.05% or less.

The material that constitutes the base material layer 2 is not limited to the above-described resin and can also be selected from the group consisting of copper, aluminum, stainless steel, and nickel. When the base material layer 2 is composed of these metals, it is possible to bring the coefficient of linear expansion of the adhesive film 1 closer to the coefficient of linear expansion of the lead frame, and the warpage of the lead frame at the time of sticking the adhesive film 1 to the lead frame can be suitably reduced.

The base material layer 2 may be subjected to a surface treatment. Examples of the type of the surface treatment include chemical treatments such as an alkali treatment and a silane coupling treatment; physical treatments such as a sand mat treatment; a plasma treatment, and a corona treatment. By applying a surface treatment, the close adhesiveness to the adhesive layer 3 can be more sufficiently increased.

From the viewpoint of reducing the warpage of a lead frame when the adhesive film 1 is stuck to the lead frame, the thickness of the base material layer 2 may be, for example, 100 μm or less, may be 50 μm or less, or may be 25 μm or less. The thickness of the base material layer 2 may be 5 μm or more or may be 10 μm or more.

The adhesive layer 3 is composed of, for example, a thermoplastic resin having an amide group (—NHCO—), an ester group (—CO—O—), an imide group (—NR$_2$, provided that each R is —CO—), an ether group (—O—), or a sulfone group (—SO$_2$—). These resins may be thermoplastic resins having an amide group, an ester group, an imide group, or an ether group. Specifically, examples of such a thermoplastic resin include an aromatic polyamide, an aromatic polyester, an aromatic polyimide, an aromatic polyamideimide, an aromatic polyether, an aromatic polyetheramideimide, an aromatic polyetheramide, an aromatic polyesterimide, and an aromatic polyetherimide. From the viewpoints of heat resistance and adhesiveness, the thermoplastic resin may be at least one resin selected from the group consisting of an aromatic polyetheramideimide, an aromatic polyetherimide, and an aromatic polyetheramide.

The above-described resins can all be produced by subjecting a base component such as an aromatic diamine or a bisphenol and an acid component such as a dicarboxylic acid, a tricarboxylic acid, a tetracarboxylic acid, or an aromatic chloride, or reactive derivatives of these to polycondensation. That is, the production of the above-described resins can be carried out by a conventional method that is used for the reaction between an amine and an acid, and there are no particular limitations in the general conditions and the like. For a polycondensation reaction between an aromatic dicarboxylic acid, an aromatic tricarboxylic acid, or reactive derivatives of these and a diamine as well, a conventional method is used.

Regarding the base component used for the synthesis of an aromatic polyetherimide, an aromatic polyetheramideimide, and an aromatic polyetheramide, for example, aromatic diamines having an ether group, such as 2,2-bis[4-(4-aminophenoxy)phenyl]propane, bis[4-(4-aminophenoxy)phenyl]sulfone, 4,4'-diaminodiphenyl ether, bis[4-(4-aminophenoxy)phenyl] ether, and 2,2-bis[4-(4-aminophenoxy)] hexafluoropropane; aromatic diamines that do not have an ether group, such as 4,4'-methylenebis(2,6-diisopropylamine); siloxanediamines such as 1,3-bis(3-aminopropyl)-tetramethyldisiloxane; and α,ω-diaminoalkanes such as 1,12-diaminododecane and 1,6-diaminohexane, can be used.

In the total amount of the base component, the above-described aromatic diamine having an ether group may be used in an amount of 40 mol % to 100 mol % or 50 mol % to 97 mol %, and at least one selected from the aromatic diamine that does not have an ether group, a siloxanediamine, and α,ω-diaminoalkane may be used in an amount of 0 mol % to 60 mol % or 3 mol % to 50 mol %. Specific examples of the base component include: (1) a base component composed of 60 mol % to 89 mol % or 68 mol % to 82 mol % of an aromatic diamine having an ether group, 1 mol % to 10 mol % or 3 mol % to 7 mol % of a siloxanediamine, and 10 mol % to 30 mol % or 15 mol % to 25 mol % of an α,ω-diaminoalkane; (2) a base component composed of 90 mol % to 99 mol % or 93 mol % to 97 mol % of an aromatic diamine having an ether group and 1 mol % to 10 mol % or 3 mol % to 7 mol % of a siloxanediamine; and (3) a base component composed of 40 mol % to 70 mol % or 45 mol % to 60 mol % of an aromatic diamine having an ether group and 30 mol % to 60 mol % or 40 mol % to 55 mol % of an aromatic diamine that does not include an ether group.

Examples of the acid component used for the synthesis of the aromatic polyetherimide, aromatic polyetheramideimide, and aromatic polyetheramide include: (A) mononuclear aromatic tricarboxylic acid anhydrides and mononuclear aromatic tetracarboxylic acid dianhydrides, such as trimellitic anhydride, a reactive derivative of trimellitic anhydride such as trimellitic anhydride chloride, and pyromellitic dianhydride; (B) polynuclear aromatic tetracarboxylic acid dianhydrides such as bisphenol A bistrimellitate dianhydride, oxydiphthalic anhydride; and (C) aromatic dicarboxylic acids such as terephthalic acid, isophthalic acid, terephthalic acid chloride, and a reactive derivative of phthalic acid such as isophthalic acid chloride. Among these, an aromatic polyetheramideimide obtainable by reacting 0.95 to 1.05 mol or 0.98 to 1.02 mol of the above-described acid component (A) per 1 mol of the above-described base component (1) or (2), and an aromatic polyetherimide obtainable by reacting 0.95 to 1.05 mol or 0.98 to 1.02 mol of the above-described acid component (B) per 1 mol of the above-described base component (3), can be used.

The adhesive layer 3 may contain a component other than the above-described resin. Examples of the other component include fillers such as a ceramic powder, a glass powder, a silver powder, a copper powder, resin particles, and rubber particles; an oxidation inhibitor; and a coupling agent. When the adhesive layer 3 contains a filler as the other component, the content of the filler may be 1 to 30 parts by mass or may be 5 to 15 parts by mass, with respect to 100 parts by mass of the resin.

Regarding the coupling agent, for example, vinylsilane, epoxysilane, aminosilane, mercaptosilane, a titanate, an aluminum chelate, a zircoaluminuate, and the like can be used. The coupling agent may be a silane coupling agent. Regarding the silane coupling agent, coupling agents having organic reactive groups at the ends of vinyltrimethoxysilane, vinyltriethoxysilane, vinyltris(β-methoxyethoxy)silane, β-(3,4-epoxycyclohexyl)ethyltrimethoxysilane, γ-glycidoxypropyltrimethoxysilane, γ-glycidoxypropylmethyldiethoxysilane, N-β-(aminoethyl)-γ-aminopropylmethyldimethoxysilane, γ-aminopropyltriethoxysilane, N-phenyl-γ-aminopropyltrimethoxysilane, γ-mercaptopropyltrimethoxysilane, and the like, and among these, an epoxysilane coupling agent having an epoxy group can be used.

The organic reactive group is a functional group such as an epoxy group, a vinyl group, an amino group, or a mercapto group. The addition of a silane coupling agent provides an effect of enhancing the close adhesiveness of the adhesive layer 3 to the base material layer 2 and suppressing the occurrence of peeling at the interface between the base material layer 2 and the adhesive layer 3 at the time of peeling at a temperature of 100 to 300° C. When the adhesive layer 3 contains a coupling agent, the content of the coupling agent may be 1 to 15 parts by mass or may be 2 to 10 parts by mass with respect to 100 parts by mass of the resin.

The thickness of the adhesive layer 3 is, for example, 20 µm or less. The thickness of the adhesive layer 3 may be 18 µm or less, 16 µm or less, 14 µm or less, 12 µm or less, 10 µm or less, 9 µm or less, or 8 µm or less. The thickness of the adhesive layer 3 is, for example, 1 µm or more. The thickness of the adhesive layer 3 may be 2 µm or more, 3 µm or more, 4 µm or more, 5 µm or more, 6 µm or more, 7 µm or more, or 8 µm or more. The thickness of the adhesive layer 3 may be 1 µm or more and 20 µm or less, may be 1 µm or more and 15 µm or less, or may be 1 µm or more and 8 µm or less.

When the thickness of the adhesive layer 3 is 1 µm or more, sufficient adhesiveness can be secured, and at the same time, fall-off of the sealing material at the time of sealing can be suppressed. When the thickness of the adhesive layer 3 is 20 µm or less, the overall layer thickness of the adhesive film 1 is suppressed, the cost is suppressed, and in addition to that, the generation of voids at the time of performing a heat treatment at 300° C. or higher can be suppressed. Furthermore, when the thickness of the adhesive layer 3 is 20 µm or less, an increase in the wettability at the time of a heat treatment can be suppressed. As a result, the adhesive layer 3 sticking to the lead frame with an excessive adhesive strength can be suppressed, and peelability can be secured.

The ratio of the thickness of the adhesive layer 3 to the thickness of the base material layer 2 is, for example, 0.2 or less. The ratio of the thickness of the adhesive layer 3 to the thickness of the base material layer 2 may be 0.1 or less or may be 0.05 or less. As a result, the warpage caused by the volume reduction at the time of solvent removal after application of the adhesive layer 3 on the base material layer 2 is suppressed, and the workability at the time of sticking the adhesive film 1 to the lead frame can be enhanced.

The glass transition temperature (Tg) of the adhesive layer 3 is higher than normal temperature (for example, 25° C.). The glass transition temperature (Tg) of the adhesive layer 3 may be, for example, 100° C. or higher or may be 150° C. or higher. The glass transition temperature of the adhesive layer 3 may be, for example, 300° C. or lower or may be 250° C. or lower. In a case where the glass transition temperature of the adhesive layer 3 is 100° C. or higher, when the adhesive film 1 is peeled off from the lead frame and the sealing material, peeling at the interface between the base material layer 2 and the adhesive layer 3 is suppressed, and the cohesive failure of the adhesive layer 3 is suppressed.

When the glass transition temperature of the adhesive layer 3 is 100° C. or higher, remaining of the adhesive layer 3 to the lead frame and the sealing material can be suppressed. Furthermore, softening of the adhesive layer 3 by the heat in the wire bonding step can be suppressed, and the occurrence of defective joining of the wire can be reduced. In addition, softening of the adhesive layer 3 caused by the heat in the sealing step can be suppressed, and the occurrence of inconvenience that the sealing material penetrates between the lead frame and the adhesive layer 3 can be suppressed. When the glass transition temperature of the adhesive layer 3 is 300° C. or lower, softening of the adhesive layer 3 at the time of adhesion is sufficiently suppressed. Furthermore, a sufficient peel strength at a peeling angle of 90° between the adhesive film 1 and the lead frame at normal temperature (for example, 25° C.) can be secured.

The glass transition temperature of the adhesive layer 3 can be measured by using a thermomechanical analysis apparatus (manufactured by Seiko Instruments Inc.: SSC5200 type). The measurement conditions can be set to, for example, a tensile mode at a distance between chucks of 10 mm, a temperature range of 30° C. to 300° C., and a rate of temperature increase of 10° C./min.

The 5% weight reduction temperature of the adhesive layer 3 may be 300° C. or higher, may be 350° C. or higher, or may be 400° C. or higher. When the 5% weight reduction temperature of the adhesive layer 3 is 300° C. or higher, outgases caused by the heat at the time of sticking the adhesive film 1 to the lead frame and the heat in the wire bonding step are not likely to be generated, and contamination of the lead frame, the wire, and the like can be suppressed. The 5% weight reduction temperature can be measured by using a differential thermal balance (for example, manufactured by Seiko Instruments Inc.: SSC5200 type). The measurement conditions can be set to, for example, a rate of temperature increase of 10° C./min in an air atmosphere.

The elastic modulus at 230° C. of the adhesive layer 3 is, for example, 1 MPa or greater. The elastic modulus at 230° C. of the adhesive layer 3 may be 3 MPa or greater. In the production process for a semiconductor package, the temperature in the wire bonding step (wire bonding temperature) is not particularly limited; however, the temperature is generally about 200 to 260° C. and is approximately 230° C. Therefore, when the elastic modulus at 230° C. of the adhesive layer 3 is 1 MPa or greater, softening of the adhesive layer 3 caused by the heat in the wire bonding step is suppressed, and the occurrence of defective joining of the wire can be suppressed. The elastic modulus at 230° C. of the adhesive layer 3 is, for example, 2000 MPa or less. The elastic modulus at 230° C. of the adhesive layer 3 may be 1500 MPa or less or may be 1000 MPa or less.

The elastic modulus at 230° C. of the adhesive layer 3 can be measured by using a dynamic viscoelasticity measuring apparatus (for example, manufactured by UBM: Rheogel-E4000). In this case, the measurement conditions can be set to a tensile mode at a distance between chucks of 20 mm, sine waves, a frequency of 10 Hz, and a rate of temperature increase of 5° C./min.

The method for forming the adhesive layer 3 on the base material layer 2 is not particularly limited; however, for example, a method of applying a resin varnish produced by dissolving a resin in a solvent on the surface of the base material layer 2 and subsequently removing the solvent by performing a heating treatment, can be used. Regarding the solvent, N-methyl-2-pyrrolidone, dimethylacetamide, diethylene glycol dimethyl ether, tetrahydrofuran, cyclohexanone, methyl ethyl ketone, dimethylformamide, and the like can be used. A method of applying a precursor varnish obtained by dissolving a precursor of a resin in a solvent on the surface of the base material layer 2 and subsequently removing the solvent by performing a heating treatment, can also be used. When the resin that constitutes the adhesive layer 3 is a polyimide resin, the precursor is, for example, polyamic acid.

The temperature of the heating treatment may be different between the case where a resin varnish is used and the case where a precursor varnish is used. In the case of a resin varnish, the temperature of the heating treatment may be any temperature at which the solvent can be removed. In the case of a precursor varnish, the temperature of the heating treatment may be equal to or higher than the glass transition temperature of the adhesive layer 3 in order to form a resin from the precursor (for example, imidization).

The method of applying a resin varnish or a precursor varnish on the surface of the base material layer 2 is not particularly limited; however, for example, roll coating, reverse roll coating, gravure coating, bar coating, comma coating, die coating, or reduced pressure die coating can be used. Furthermore, the resin varnish or the precursor varnish may be applied on the surface of the base material layer 2 by immersing the base material layer 2 in the resin varnish or the precursor varnish.

Figure 2:
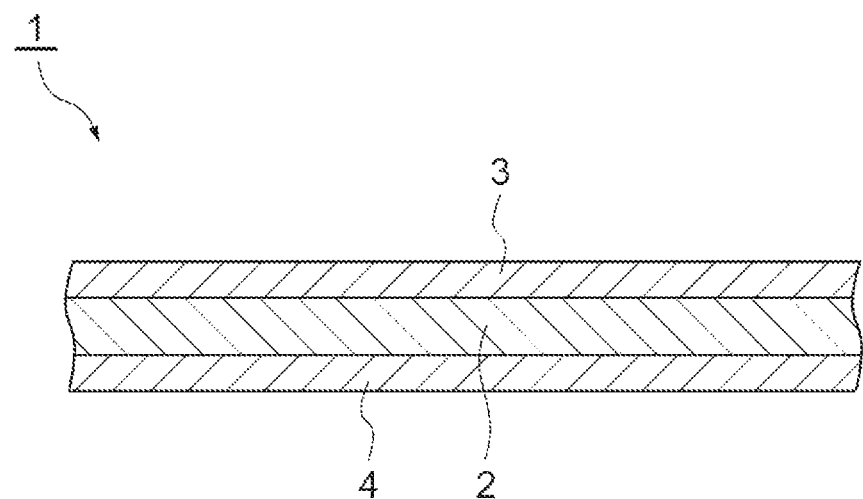
FIG. 2 is a schematic cross-sectional view illustrating another embodiment of the adhesive film.

As shown in FIG. 2, the adhesive film 1 may be configured to have three layers by further including a non-adhesive layer 4 on the other surface side of the base material layer 2 (opposite surface side of the adhesive layer 3). The non-adhesive layer 4 is a resin layer that substantially does not have adhesiveness (or pressure-sensitive adhesiveness) to the lead frame at 0° C. to 270° C.

For the formation of the non-adhesive layer 4, for example, a thermoplastic resin or a thermosetting resin can be used. Regarding the thermoplastic resin, for example, a resin having an amide group, an ester group, an imide group, or an ether group may be mentioned. The thermoplastic resin may be an aromatic polyetheramideimide obtainable by reacting 1 mol of the above-mentioned base component and 0.95 to 1.05 mol or 0.98 to 1.02 mol of the above-mentioned acid component.

Examples of the thermosetting resin include an epoxy resin, a phenol resin, and a bismaleimide resin (for example, a bismaleimide resin having bis(4-maleimidophenyl)methane as a monomer). A thermoplastic resin and a thermosetting resin may be used as a mixture. In the case of using a thermoplastic resin and a thermosetting resin in combination, the amount of the thermosetting resin may be 5 to 100 parts by mass or may be 20 to 70 parts by mass with respect to 100 parts by mass of the thermoplastic resin.

The non-adhesive layer 4 may contain components other than the above-described resin. Examples of the other components include a filler and a coupling agent. When the non-adhesive layer 4 contains a filler as the other component, the content of the filler may be 1 to 30 parts by mass or may be 5 to 15 parts by mass with respect to 100 parts by mass of the resin. When the non-adhesive layer 4 contains a coupling agent as the other component, the content of the coupling agent may be 1 to 20 parts by mass or may be 5 to 15 parts by mass with respect to 100 parts by mass of the resin.

The thickness of the non-adhesive layer 4 is, for example, 10 μm or less. The thickness of the non-adhesive layer 4 may be 9 μm or less, 8 μm or less, or 7 μm or less. The thickness of the non-adhesive layer 4 is, for example, 1 μm or more. The thickness of the non-adhesive layer 4 may be 2 μm or more, 3 μm or more, 4 μm or more, 5 μm or more, or 6 μm or more. The thickness of the non-adhesive layer 4 may be, for example, 1 μm or more and 10 μm or less or may be 1 μm or more and 8 μm or less. The ratio of the thickness of the adhesive layer 3 to the thickness of the non-adhesive layer 4 may be 1.0 to 2.0 or may be 1.3 to 2.0.

The elastic modulus at 230° C. of the non-adhesive layer 4 is, for example, 10 MPa or greater. The elastic modulus at 230° C. of the non-adhesive layer 4 may be 100 MPa or greater or may be 1000 MPa or greater. When the elastic modulus at 230° C. of the non-adhesive layer 4 is 10 MPa or greater, softening of the non-adhesive layer 4 in a step where heat is applied, such as a wire bonding step, can be suppressed, and sticking to the mold, jigs, and the like can be prevented. The elastic modulus at 230° C. of the non-adhesive layer 4 may be 2000 MPa or less or may be 1800 MPa or less. The elastic modulus at 230° C. of the non-adhesive layer 4 can be measured by a method similar to the case of the elastic modulus at 230° C. of the above-mentioned adhesive layer 3.

The peel strength at a peeling angle of 90° between the non-adhesive layer 4 and the mold as well as the jig at normal temperature (for example, 25° C.) may be less than 5 N/m or may be 1 N/m or less. The measurement of this peel strength is carried out, for example, after pressure-bonding the non-adhesive layer 4 to a mold made of brass at a temperature of 250° C. and a pressure of 8 MPa for 10 seconds.

The glass transition temperature of the non-adhesive layer 4 is, for example, 150° C. or higher. The glass transition temperature of the non-adhesive layer 4 may be 200° C. or higher or may be 250° C. or higher. When the glass transition temperature of the non-adhesive layer 4 is 150° C. or higher, softening of the non-adhesive layer 4 in a step of adhering a semiconductor element to a die pad, a wire bonding step, a sealing step, a step of peeling off the adhesive film 1 from a sealed body, and the like can be suppressed. Furthermore, sticking of the non-adhesive layer 4 to the mold and jigs can be suppressed. The glass transition temperature of the non-adhesive layer 4 may be 350° C. or lower or may be 300° C. or lower.

The method for forming the non-adhesive layer 4 on the base material layer 2 is not particularly limited; however, as in the case of the above-mentioned adhesive layer 3, a method of applying a resin varnish or a precursor varnish on the base material layer 2 can be employed. When a thermosetting resin is used as a constituent material of the non-adhesive layer 4, or when a thermoplastic resin and a thermosetting resin are used in combination, the thermosetting resin can be cured by a heating treatment after application to adjust the elastic modulus of the non-adhesive layer 4 to 10 MPa or greater. This heating treatment may be carried out simultaneously with removal of the solvent or imidization or may be carried out separately therefrom.

When the non-adhesive layer 4 such as described above is provided on the base material layer 2, the warpage of the adhesive film 1 caused by the volume reduction of the adhesive layer 3 can be canceled by the volume reduction of the non-adhesive layer 4 at the time of solvent removal, and shrinkage of the non-adhesive layer 4 at the time of imidization of the non-adhesive layer 4, curing of the thermosetting resin, and the like.

[Adhesive Film Production Apparatus]

Next, the adhesive film production apparatus used for the production of the adhesive film 1 will be described in detail.

FIG. 3 is a schematic perspective view illustrating an embodiment of the adhesive film production apparatus. In FIG. 3, the right-to-left direction is designated as the horizontal direction, and the up-to-down direction is designated as the vertical direction. The adhesive film production apparatus 11 shown in the same diagram is configured to be an apparatus that cuts a plurality of adhesive films 1 from a raw film B of an adhesive film 1 and winding each of the cut adhesive films 1 to form reel bodies R. As shown in FIG. 3, the adhesive film production apparatus 11 includes a feeding roller 12, a cutting part 13, and a plurality of winding cores 14. Here, the production of an adhesive film 1 having a two-layer configuration as shown in FIG. 1 will be described as an example.

Figure 4:
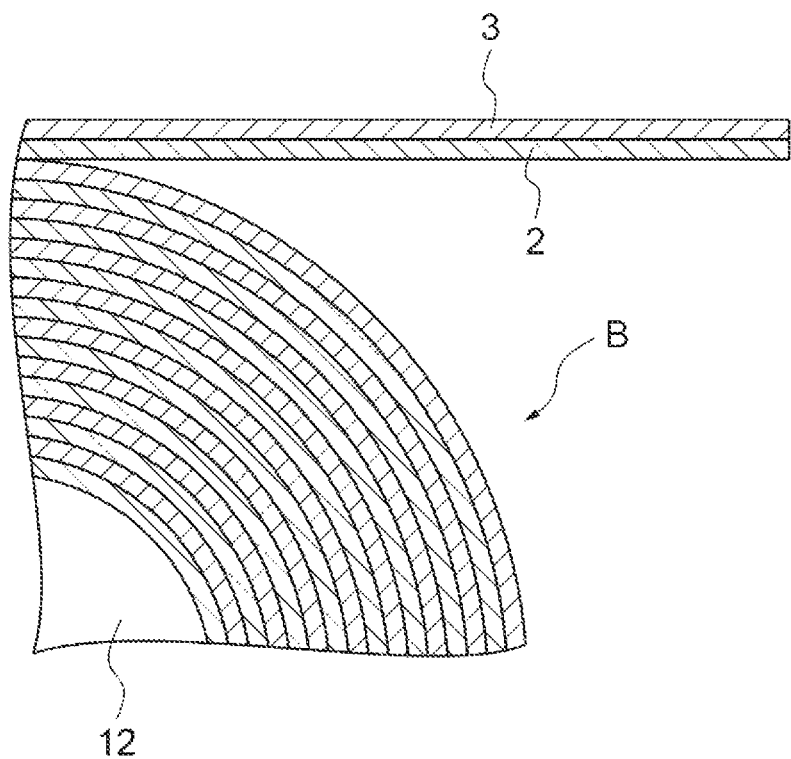
FIG. 4 is a schematic cross-sectional view illustrating a winding state of a raw film of the adhesive film in a feeding roller.

The feeding roller 12 is a portion that continuously feeds out the raw film B of the adhesive film 1. On the feeding roller 12, as shown in FIG. 4, the raw film B of the adhesive film 1 is wound around such that the adhesive layer 3 faces outward. That is, on the feeding roller 12, the raw film B of the adhesive film 1 is wound around such that the adhesive layer 3 bends in a convex manner. The raw film B of the adhesive film 1 continuously paid out from the feeding roller 12 is horizontally conveyed toward the cutting part 13 at a predetermined speed.

Figure 5:
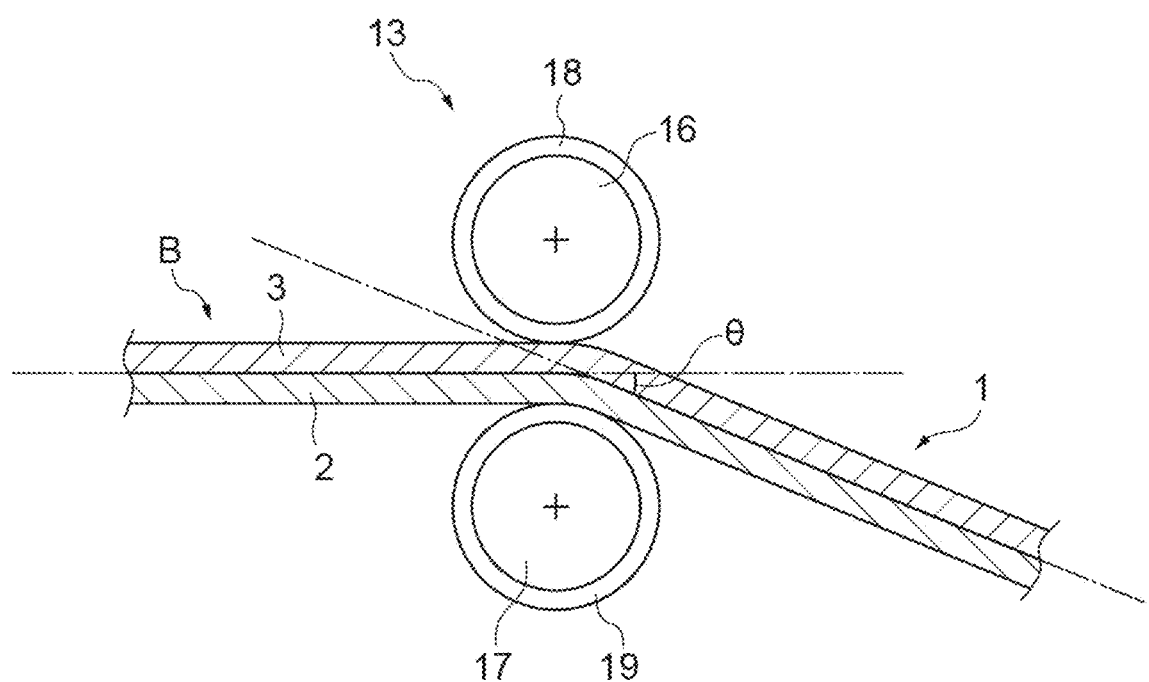
FIG. 5 is a schematic cross-sectional view illustrating a conveyance state of the adhesive film from a cutting part toward a winding core.

The cutting part 13 is a portion that cuts out a plurality of adhesive films 1 at a predetermined width from the raw film B of the adhesive film 1. As shown in FIG. 5, the cutting part 13 has an upper shaft 16 and a lower shaft 17 disposed as a pair disposed up and down with the raw film B interposed therebetween; a plurality of disc-shaped upper blades 18 provided on the upper shaft 16; and a plurality of disc-shaped lower blades 19 provided on the lower shaft 17. In the embodiment of FIG. 5, the upper blades 18 face the adhesive layer 3, and the lower blades 19 face the base material layer 2. The upper blades 18 and the lower blades 19 are in a state in which, for example, the side surfaces of the blade tips are in sliding contact with each other, and the raw film B is cut by a shear cutting method. The widths of the plurality of adhesive films 1 cut by the cutting part 13 are adjusted by changing the distances in the axial direction between the upper blades 18 and the lower blades 19. In the present embodiment, a plurality of adhesive films 1 having different widths are cut out from the raw film B of the adhesive film 1 by the cutting part 13.

The plurality of winding cores 14 is a portion on which each of the plurality of adhesive films 1 is wound. On the winding core 14, the adhesive film 1 is wound such that the feeding roller 12 and the adhesive layer 3 face outward. The winding cores 14 may be classified into the case where an adhesive film 1 having a two-layer configuration as shown in FIG. 1 is wound, and the case where an adhesive film 1 having a three-layer configuration as shown in FIG. 2 is wound. The plurality of winding cores 14 have a first winding core 14A positioned on a first shaft G1 and a second winding core 14B positioned on a second shaft G2. The first shaft G1 and the second shaft G2 are positioned at positions that are at least shifted from each other in the horizontal direction, and the first winding core 14A and the second winding core 14B are alternately disposed in the axial directions.

Here, in the conveyance path of the adhesive film 1 traveling from the cutting part 13 toward the winding cores 14, the number of times of the adhesive layer 3 of the adhesive film 1 bending in a convex manner is equal to or more than the number of times of the adhesive layer 3 bending in a concave manner. In the form shown in FIG. 3, the first shaft G1 on which the first winding core 14A is positioned is disposed such that the conveyance direction of the adhesive film 1 traveling from the cutting part 13 toward the first winding core 14A is maintained horizontally similarly to the conveyance direction of the raw film B. On the other hand, the second shaft G2 on which the second winding core 14B is disposed below the first shaft G1 such that, as shown in FIG. 3 and FIG. 5, the adhesive layer 3 of the adhesive film 1 traveling from the cutting part 13 toward the second winding core 14B bends in a convex manner. As the result, the adhesive film 1 traveling from the cutting part 13 toward the first winding core 14A is wound by the first winding core 14A such that the adhesive layer 3 bends neither in a convex manner nor in a concave manner, and the adhesive film 1 traveling from the cutting part 13 toward the second winding core 14B is wound by the second winding core 14B such that the adhesive layer 3 bends only in a convex manner.

Figure 6:
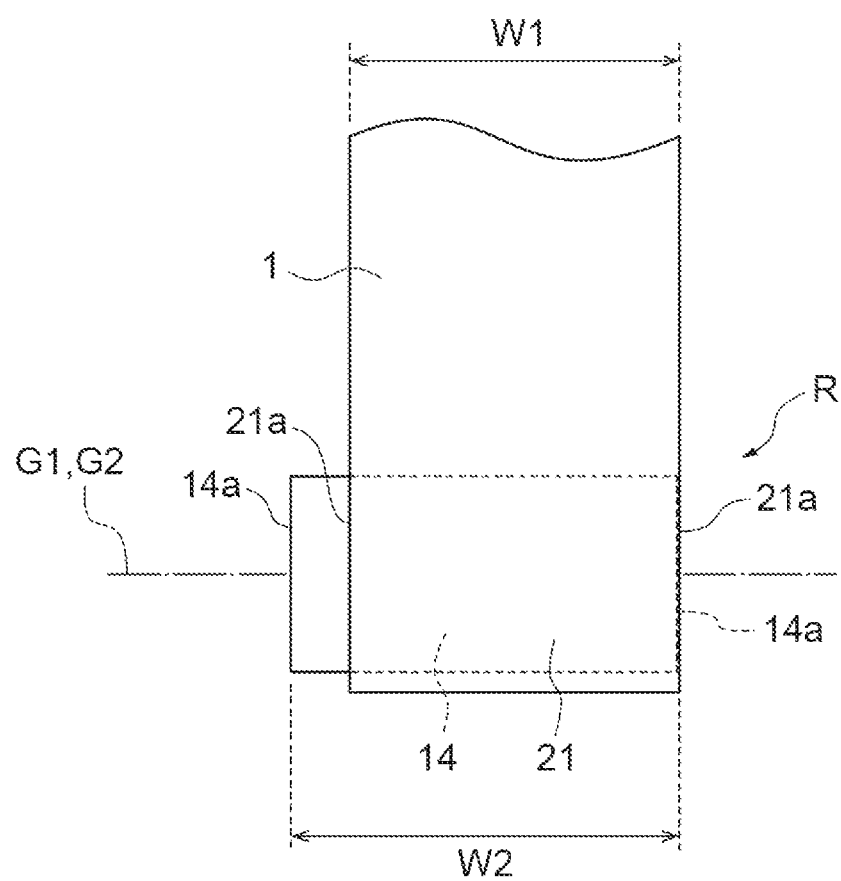
FIG. 6 is a plan view illustrating a winding state of the adhesive film on the winding core.

Furthermore, each of the first winding core 14A and the second winding core 14B has a width W2 larger than a width W1 of the adhesive film 1 as an object of winding, as shown in FIG. 6. As a result, in a reel body R obtained by winding the adhesive film 1 on each of the first winding core 14A and the second winding core 14B, an edge part 14a of the winding core 14 protrudes from a side surface 21a of a rolled body 21 of the adhesive film 1. As an example, when the width W1 of the adhesive film 1 as an object of winding is 50 mm or more and less than 55 mm, the width W2 of the winding core 14 for winding this adhesive film can be set to 55 mm. Furthermore, in the example of FIG. 6, the central position in the axial direction of the winding core 14 is in a shifted state with respect to the central position in the width direction of the adhesive film 1. As a result, in the reel body R, the edge part 14a of the winding core 14 protrudes only from one side surface 21a in the rolled body 21 of the adhesive film 1, and the other side surface 21a is flush with the edge part 14a of the winding core 14.

Winding tension is applied to the raw film B and the plurality of adhesive films 1 extending from the feeding roller 12 through the cutting part 13 to the winding cores 14. For the impartment of the winding tension to the raw film B and the plurality of adhesive films 1, tension rollers may be used, or an adjustment mechanism for adjusting the axial positions of the feeding roller 12 and the winding cores 14 may be used. The winding tension to be applied to the raw film B and the plurality of adhesive films 1 is not particularly limited; however, for example, the winding tension is 60 N/m or more. The winding tension may be 70 N/m or more or may be 80 N/m or more. The winding tension is, for example, 150 N/m or less. The winding tension may be 140 N/m or less or may be 130 N/m or less.

[Method for Producing Adhesive Film]

Figure 7:
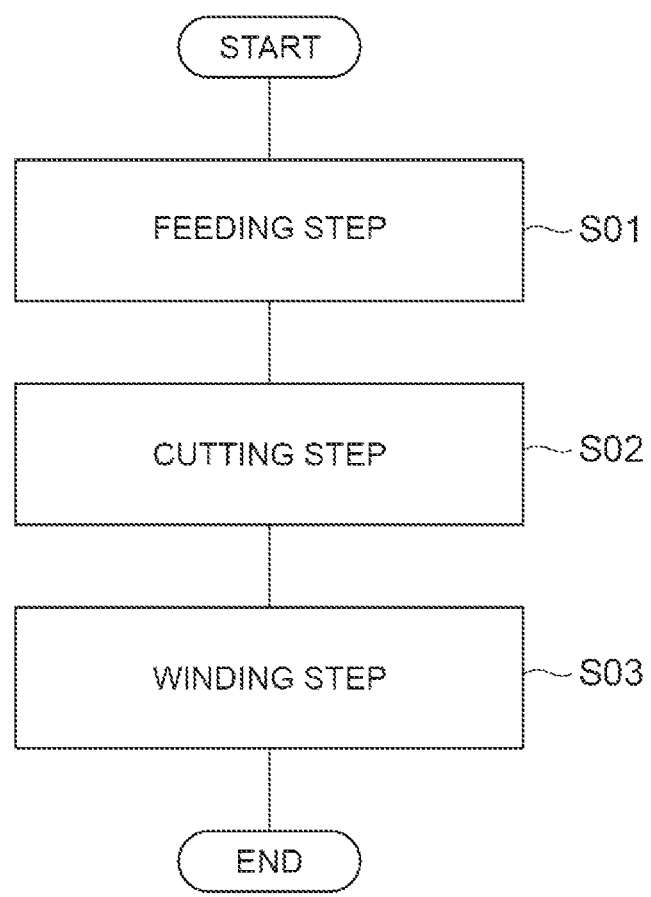
FIG. 7 is a schematic perspective view illustrating an embodiment of a method for producing an adhesive film.

FIG. 7 is a flow chart showing an embodiment of a method for producing an adhesive film. In the present embodiment, the method for producing an adhesive film is carried out by using the above-described adhesive film production apparatus 11. In this method for producing an adhesive film, first, the raw film B of the adhesive film 1 is continuously paid out from the feeding roller (step S01: feeding step). In the feeding step, the raw film B of the adhesive film 1 is wound around the feeding roller 12 such that the adhesive layer 3 faces outward. That is, the raw film B of the adhesive film 1 is wound around the feeding roller 12 such that the adhesive layer 3 bends in a convex manner. Then, the raw film B of the adhesive film 1 continuously paid out from the feeding roller 12 is conveyed horizontally toward the cutting part 13 at a predetermined speed.

Next, the raw film B of the adhesive film 1 is cut out into a plurality of adhesive films 1 having predetermined widths by the cutting part 13 (step S02: cutting step). In the cutting step, a plurality of adhesive films 1 having different widths are cut out from the raw film B of the adhesive film 1 by the cutting part 13.

After the plurality of adhesive films 1 are cut out, each of these adhesive films 1 is wound on each of a plurality of winding cores 14 (step S03: winding step). In the winding step, the adhesive film 1 traveling from the cutting part 13 toward the second winding core 14B is conveyed such that the adhesive layer 3 bends in a convex manner and then wound. Furthermore, in the reel body R in which the adhesive film 1 is wound on each of the first winding core 14A and the second winding core 14B, the edge part 14a of the winding core 14 is caused to protrude from one side surface 21a of the rolled body 21 of the adhesive film 1.

[Operating Effect]

As described above, in the adhesive film production apparatus 11, the raw film B of the adhesive film 1 is wound around the feeding roller 12 such that the adhesive layer 3 faces outward. Furthermore, in the conveyance path of the adhesive film 1 traveling from the cutting part 13 toward the winding core 14, the number of times of the adhesive layer 3 of the adhesive film 1 bending in a convex manner is equal to or more than the number of times of the adhesive layer 3 bending in a concave manner. In the adhesive film 1 having the adhesive layer 3 on the base material layer 2, warpage in which the adhesive layer 3 side having a lower elastic modulus as compared with the base material layer 2 becomes a valley is likely to occur. In the adhesive film 1, since the elastic modulus of the adhesive layer 3 is relatively high, and the glass transition temperature is higher than normal temperature, there is a tendency that once warpage occurs in the adhesive film 1, warpage is less likely to be reduced even when flexure is increased. In contrast, in this adhesive film production apparatus 11, on the occasion that the adhesive film travels from the feeding roller 12 through the cutting part 13 and is wound on the winding core 14, flexure that causes the adhesive layer 3 side to have a convex shape is actively imparted to the adhesive film 1. Therefore, in the adhesive film 1 wound around the winding core 14, warpage is canceled, and the warpage at the time of use can be suppressed.

Furthermore, in the adhesive film production apparatus 11, each of the plurality of winding cores 14 has a width W2 larger than the width W1 of the adhesive film 1 as an object of winding. As a result, winding of adhesive films 1 having different widths can be performed by using winding cores 14 having the same width. Therefore, reduction of the cost required for winding cores 14 and simplification of the management of winding cores 14 can be promoted. Furthermore, since the edge part 14a of the winding core 14 protrudes from the adhesive film 1 as an object of winding, when the adhesive film 1 wound around the winding core 14 is used, alignment of the adhesive film 1 is made easier by utilizing the protruding portion of the winding core 14.

Furthermore, in the adhesive film production apparatus 11, each of the plurality of winding cores 14 is disposed such that the edge part 14a of the winding core 14 protrudes only on one side in the axial direction from the adhesive film 1 as an object of winding. As a result, when the adhesive film 1 wound around the winding core 14 is used, alignment of the adhesive film 1 is made much easier.

Furthermore, in the adhesive film production apparatus 11, the raw film B of the adhesive film 1 is cut out into a plurality of adhesive films 1 having different widths by the cutting part 13. As a result, adhesive films 1 having different widths can be produced all at one time.

Furthermore, in the adhesive film production apparatus 11, winding tension is applied to the raw film B and the plurality of adhesive films 1 between the feeding roller 12 and the winding cores 14. As a result, sliding of the adhesive film 1 at the time of winding the adhesive film 1 on the winding cores 14 can be suppressed.

Modification Example

Figure 8:
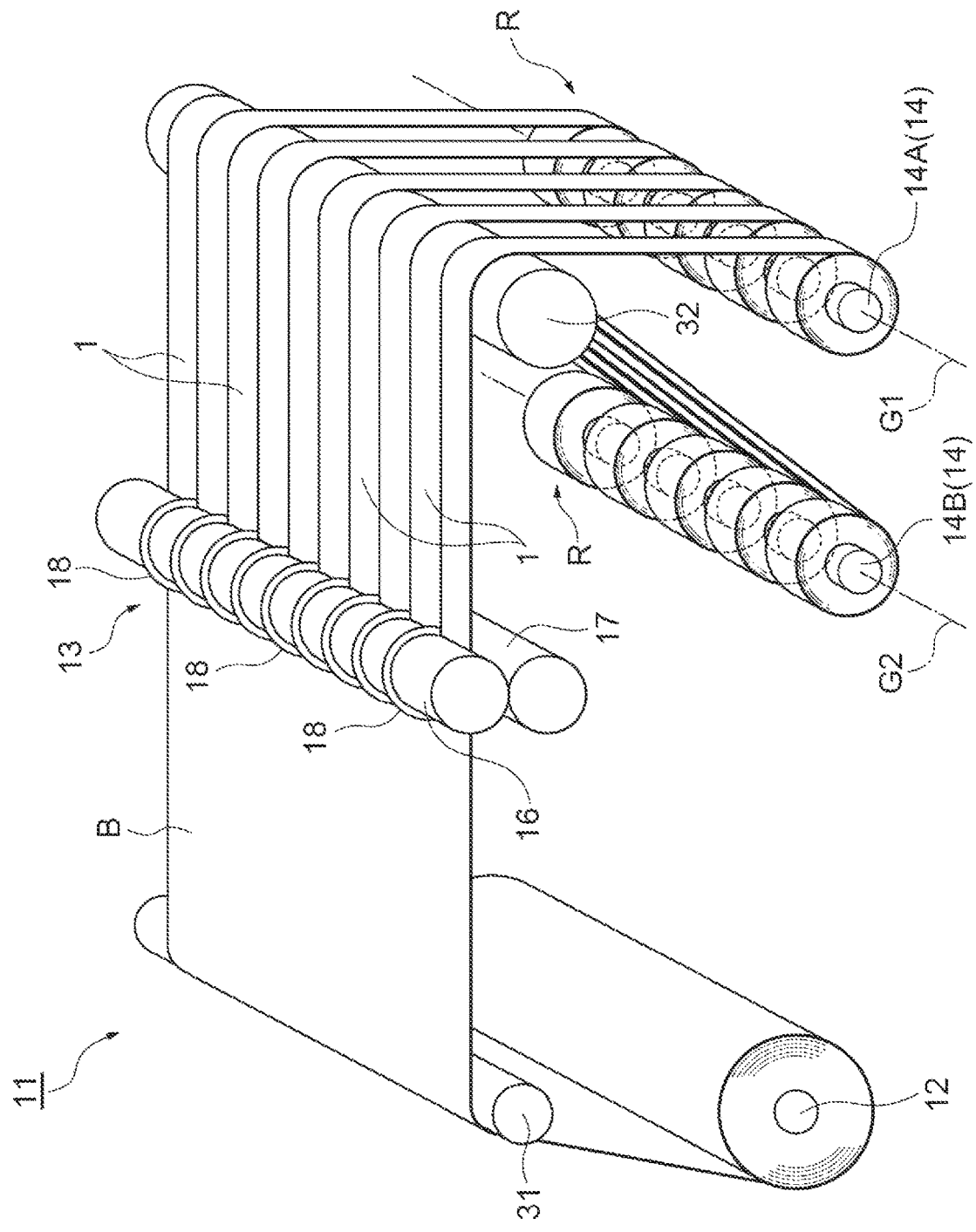
FIG. 8 is a schematic perspective view illustrating another embodiment of an adhesive film production apparatus.

The present disclosure is not limited to the above-described embodiments. FIG. 8 is a schematic perspective view illustrating another embodiment of the adhesive film production apparatus. In the example of FIG. 3, the raw film B continuously paid out from the feeding roller 12 is conveyed in the horizontal direction toward the cutting part 13; however, as in the case of example of FIG. 8, a roller 31 that applies tension to the raw film B may be disposed between the feeding roller 12 and the cutting part 13, and the raw film B may be caused to bend in a convex manner by means of this roller 31. It is also acceptable to dispose a plurality of rollers similar to the roller 31 and cause the raw film B between the feeding roller 12 and the cutting part 13 to bend multiple times in a convex manner and in a concave manner. In this case, in the conveyance path of the raw film B traveling from the feeding roller 12 toward the cutting part 13, the number of times of the adhesive layer 3 of the raw film B bending in a convex manner may be equal to or more than the number of times of the adhesive layer 3 bending in a concave manner. When the raw film B is caused to bend multiple times, the final bending (bending on the side closest to the cutting part 13) may be bending in a convex manner.

Furthermore, in the example of FIG. 3, only the adhesive layer 3 of the adhesive films 1 traveling from the cutting part 13 toward the second winding cores 14B bends in an arc; however, as in the case of the example of FIG. 8, a roller 32 that applies winding tension to the adhesive films 1 may be disposed between the cutting part 13 and the winding cores 14, and the adhesive films 1 may be caused to bend in a convex manner by means of this roller 32. It is also acceptable to dispose a plurality of rollers similar to the roller 32 and cause adhesive films 1 between the cutting part 13 and the winding cores 14 to bend multiple times in a convex manner and in a concave manner. In this case, in the conveyance path of the adhesive film 1 traveling from the cutting part 13 toward the winding core 14, the number of times of the adhesive layer 3 of the adhesive film 1 bending in a convex manner may be equal to or more than the number of times of the adhesive layer 3 bending in a concave manner. When the adhesive film 1 is caused to bend multiple times, the final bending (bending on the side closest to the winding core 14) may be bending in a convex manner.

In the example of FIG. 8, the first shaft G1 on which the first winding core 14A is positioned and the second shaft G2 on which the second winding core 14B is positioned are positioned at the same position in the vertical direction. The first winding core 14A is disposed such that the conveyance direction of the adhesive film 1 traveling from the cutting part 13 toward the first winding core 14A bends at an approximately right angle with respect to the roller 32, and the second winding core 14B is disposed such that the conveyance direction of the adhesive film 1 traveling from the cutting part 13 toward the second winding core 14B bends at an acute angle with respect to the roller 32. As the result, each of the adhesive film 1 traveling from the cutting part 13 toward the first winding core 14A and the adhesive film 1 traveling from the cutting part 13 toward the second winding core 14B is such that the adhesive layer 3 bends only in a convex manner and is wound by a winding core 14.

Furthermore, in the example of FIG. 6, the edge part 14a of the winding core 14 protrudes only from one side surface 21a in the rolled body 21 of the adhesive film 1, and the other side surface 21a is flush with the edge part 14a of the winding core 14; however, it is also acceptable that each of the edge parts 14a of the winding core 14 protrude from the one side surface 21a and the other side surface 21a in the rolled body 21 of the adhesive film 1. That is, the edge parts 14a of the winding core 14 may protrude on both sides in the axial direction from the adhesive film 1 as an object of winding.

In this case, in the rolled body 21 of the adhesive film 1, the amount of protrusion of the edge part 14a of the winding core 14 from one side surface 21a may be equal to the amount of protrusion of the edge part 14a of the winding core 14 from the other side surface 21a. Furthermore, in the rolled body 21 of the adhesive film 1, the amount of protrusion of the edge part 14a of the winding core 14 from one side surface 21a may be larger than the amount of protrusion of the edge part 14a of the winding core 14 from the other side surface 21a. Even in such a configuration, when the adhesive film 1 wound around the winding core 14 is used, alignment of the adhesive film 1 is made much easier. The ratio of the amount of protrusion of the edge part 14a of the winding core 14 from one side surface 21a with respect to the amount of protrusion of the edge part 14a of the winding core 14 from the other side surface 21a may be, for example, 0.02 to 5.00, or may be 0.04 to 3.00.

REFERENCE SIGNS LIST

1: adhesive film, 2: base material layer, 3: adhesive layer, 11: adhesive film production apparatus, 12: feeding roller, 13: cutting part, 14: winding core, 14a: edge part, B: raw film, W1: width of adhesive film, W2: width of winding core.

The invention claimed is:

1. An adhesive film production apparatus for producing reels of an adhesive film having an adhesive layer on a base material layer, the adhesive layer having an elastic modulus at 230° C. of 1 MPa or greater and having a glass transition temperature higher than normal temperature, the adhesive film production apparatus comprising:
    a feeding roller configured to continuously feed a raw film of the adhesive film;
    a cutting part configured to cut the raw film of the adhesive film into a plurality of cut adhesive films having predetermined widths; and
    a plurality of winding cores configured to wind the plurality of cut adhesive films, respectively,
    wherein the adhesive film production apparatus is configured to convey the cut adhesive films along conveyance paths extending toward the winding cores,
    wherein the conveyance paths include one or more bending conveyance paths,
    wherein each of the conveyance paths that is configured to form one or more bend in a corresponding cut adhesive film prior to being wound around a corresponding winding core, is included in the one or more bending conveyance paths, and
    wherein in each bending conveyance path, at least half a number of the one or more bend forms a convex shape of the adhesive layer, in which the adhesive layer faces outwardly and convexly.

2. The adhesive film production apparatus according to claim 1, wherein each winding core among the plurality of winding cores has a width greater than the width of a corresponding cut adhesive film to be wound around the winding core.

3. The adhesive film production apparatus according to claim 2, wherein each winding core among the plurality of winding cores, is disposed such that an edge part of the winding core protrudes only on one side from the corresponding cut adhesive film, in an axial direction of the winding core.

4. The adhesive film production apparatus according to claim 2, wherein a central position in an axial direction of each winding core is shifted from a central position in a width direction of the corresponding cut adhesive film.

5. The adhesive film production apparatus according to claim 1, wherein the cutting part is set to cause the predetermined widths of the cut adhesive films to include at least two different widths.

6. The adhesive film production apparatus according to claim 1,
    wherein the raw film is conveyed to the cutting part in a linear direction,
    wherein the conveyance paths include one or more linear conveyance paths configured to convey corresponding one or more cut adhesive films from the cutting part to corresponding one or more winding cores, in a same direction as the linear direction of the raw film, so as to form no bend in the corresponding one or more cut adhesive films with respect to the raw film conveyed to the cutting part, and
    wherein each of the conveyance paths is selected from the one or more linear conveyance paths, or from the one or more bending conveyance paths.

7. The adhesive film production apparatus according to claim 1, wherein the one or more bending conveyance paths corresponds to all of the conveyance paths.

8. The adhesive film production apparatus according to claim 1,
    wherein the conveyance paths are configured to form a plurality of bends including the one or more bend, in the plurality of cut adhesive films prior to being wound around the winding cores, and
    wherein all of the plurality of bends form the convex shape of the adhesive layer.

9. The adhesive film production apparatus according to claim 1, wherein the one or more bend includes a bend that is formed at the cutting part, to bend the corresponding cut adhesive film with respect to a portion of the raw film that extends linearly to the cutting part.

10. The adhesive film production apparatus according to claim 1, further comprising a tension device located along the conveyance paths,
    wherein the tension device is configured to convey a first cut adhesive film in a first linear direction, and to convey a second cut adhesive film in a second linear direction that is different from the first linear direction,
    wherein the first cut adhesive film and the second cut adhesive film are selected from the plurality of cut adhesive films,
    wherein the first linear direction is set to convey the first cut adhesive film from the tension device at a first angle with respect to a portion of the adhesive film that is conveyed linearly to the tension device,
    wherein the second linear direction is set to convey the second cut adhesive film from the tension device at a second angle with respect to a portion of the adhesive film that is conveyed linearly to the tension device, and
    wherein each of the first angle and the second angle taken at an outer surface formed by the adhesive layer of the adhesive film, is equal to or greater than 180 degrees.

11. A method using the adhesive film production apparatus of claim 1, for producing the reels of the adhesive film, the method comprising:
    feeding the raw film of the adhesive film continuously from the feeding roller, wherein the raw film is wound around the feeding roller such that the adhesive layer faces outwardly;

cutting the raw film of the adhesive film into the plurality of cut adhesive films having the predetermined widths via the cutting part, wherein the raw film that is fed from the feeding roller to the cutting part forms one or more bend, wherein at least half of a number of the one or more bend formed in the raw film that is fed, forms the convex shape of the adhesive layer, in which the adhesive layer faces outwardly and convexly; and winding the plurality of cut adhesive films on the plurality of winding cores, respectively.

12. The method for producing an adhesive film according to claim 11, wherein, in the winding, the width of each winding core among the plurality of winding cores is greater than the width of a corresponding cut adhesive film that is wound around the winding core, and wherein, in the winding, a central position in an axial direction of each winding core is shifted from a central position in a width direction of the corresponding cut adhesive film.

13. The method for producing an adhesive film according to claim 12, wherein, in the winding, each winding core among the plurality of winding cores, is disposed such that an edge part of the winding core protrudes only on one side from the corresponding cut adhesive film, in an axial direction of the winding core.

14. The method for producing an adhesive film according to claim 11, wherein the predetermined widths of the cut adhesive films include at least two different widths.

15. An adhesive film production apparatus for producing reels of an adhesive film having an adhesive layer on a base material layer, the adhesive film production apparatus comprising:

a feeding roller configured to feed a raw film of the adhesive film;

a cutting part configured to cut the raw film into a plurality of cut adhesive films having predetermined widths; and a plurality of winding cores configured to respectively wind the plurality of cut adhesive films, wherein the adhesive film production apparatus is configured to convey the cut adhesive films toward the winding cores, along conveyance paths, respectively, wherein the conveyance paths are configured to form one or more bend in the plurality of cut adhesive films, prior to being wound around the winding cores, and wherein more than half of a total number of the one or more bend, form a convex shape of the adhesive layer, in which the adhesive layer faces outwardly and convexly.

16. The adhesive film production apparatus according to claim 15, wherein the one or more bend corresponds to a plurality of bends, and wherein each of the plurality of bends forms the convex shape of the adhesive layer.

17. The adhesive film production apparatus according to claim 15, wherein the raw film fed by the feeding roller is wound around the feeding roller such that the adhesive layer faces outwardly, wherein a location of each of the one or more bend is selected from a location of the cutting part or a midpoint between the cutting part and a corresponding winding core, and wherein each of the one or more bend is formed between a pair of linearly extending portions of the adhesive film in a conveyance direction of the adhesive film.

18. An adhesive film production apparatus for producing reels of an adhesive film having an adhesive layer on a base material layer, the adhesive film production apparatus comprising:

a feeding roller configured to feed a raw film of the adhesive film;

a cutting part configured to cut the raw film at one or more positions in a width direction of the raw film, into a plurality of cut adhesive films that include a first cut adhesive film and a second cut adhesive film;

a plurality of winding cores configured to respectively wind the plurality of cut adhesive films; and a tension device that is configured to convey the first cut adhesive film in a first linear direction, and to convey a second cut adhesive film in a second linear direction that is different from the first linear direction, wherein the first linear direction is set to convey the first cut adhesive film from the tension device at a first angle with respect to a portion of the adhesive film that is conveyed linearly to the tension device, wherein the second linear direction is set to convey the second cut adhesive film from the tension device at a second angle with respect to the portion of the adhesive film that is conveyed linearly to the tension device, and wherein each of the first angle and the second angle taken at an outer surface of the adhesive film, that is formed by the adhesive layer, is equal to or greater than 180 degrees.

19. The adhesive film production apparatus according to claim 18, wherein a location of the tension device is selected from a location of the cutting part or a midpoint between the cutting part and the winding cores.

20. The adhesive film production apparatus according to claim 18, wherein the tension device is a tension roller, and wherein the first linear direction and the second linear direction are set to form a convex shape of the adhesive layer, in which the adhesive layer faces outwardly and convexly around the tension roller, in both the first cut adhesive film and the second cut adhesive film.

* * * * *